(12) United States Patent
Komijani et al.

(10) Patent No.: US 7,330,076 B2
(45) Date of Patent: Feb. 12, 2008

(54) RECONFIGURABLE DISTRIBUTED ACTIVE TRANSFORMERS

(75) Inventors: Abbas Komijani, Los Angeles, CA (US); Seyed-Ali Hajimiri, Pasadena, CA (US); Scott D. Kee, Tustin, CA (US); Ichiro Aoki, Arcadia, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/544,895

(22) Filed: Oct. 6, 2006

(65) Prior Publication Data

US 2007/0030071 A1    Feb. 8, 2007

Related U.S. Application Data

(63) Continuation of application No. 11/037,527, filed on Jan. 18, 2005, now Pat. No. 7,119,619, which is a continuation of application No. 10/386,001, filed on Mar. 11, 2003, now Pat. No. 6,856,199, and a continuation-in-part of application No. 09/974,578, filed on Oct. 9, 2001, now Pat. No. 6,816,012.

(60) Provisional application No. 60/363,424, filed on Mar. 11, 2002, provisional application No. 60/239,470, filed on Oct. 10, 2000, provisional application No. 60/239,474, filed on Oct. 10, 2000, provisional application No. 60/288,601, filed on May 4, 2001.

(51) Int. Cl.
*H03F 3/26* (2006.01)

(52) U.S. Cl. ....................... 330/276; 330/286

(58) Field of Classification Search ............ 330/124 R, 330/188, 276, 286, 295, 307
See application file for complete search history.

(56) References Cited

U.S. PATENT DOCUMENTS 3,098,200 A    7/1963    Jensen (Continued)

FOREIGN PATENT DOCUMENTS

DE    12 76 764 B    9/1968

(Continued)

OTHER PUBLICATIONS

"The Modeling, Characterization, and Design of Monolithic Inductors for Silicon RF IC's," Long et al., *IEEE Journal of Solid-State Circuits*, vol. 32, No. 3, pp. 357-369, Mar. 1997.

(Continued)

*Primary Examiner*—Khanh Van Nguyen
(74) *Attorney, Agent, or Firm*—Jackson Walker L.L.P.; Christopher J. Rourk

(57) ABSTRACT

Reconfigurable distributed active transformers are provided. The exemplary embodiments provided allow changing of the effective number and configuration of the primary and secondary windings, where the distributed active transformer structures can be reconfigured dynamically to control the output power levels, allow operation at multiple frequency bands, maintain a high performance across multiple channels, and sustain desired characteristics across process, temperature and other environmental variations. Integration of the distributed active transformer power amplifiers and a low noise amplifier on a semiconductor substrate can also be provided.

20 Claims, 8 Drawing Sheets

U.S. PATENT DOCUMENTS

| | | | |
|---|---|---|---|
| 3,157,839 | A | 11/1964 | Brown et al. |
| 3,703,685 | A | 11/1972 | Simopoulos et al. |
| 3,919,660 | A | 11/1975 | Beurrier |
| 4,283,685 | A | 8/1981 | MacMaster et al. |
| 4,305,043 | A | 12/1981 | Ho et al. |
| 4,706,038 | A | 11/1987 | Navidi et al. |
| 4,916,410 | A | 4/1990 | Littlefield |
| 5,066,925 | A | 11/1991 | Freitag |
| 5,130,664 | A | 7/1992 | Pavlic et al. |
| 5,208,725 | A | 5/1993 | Akcasu |
| 5,223,800 | A | 6/1993 | Karsten, Jr. et al. |
| 5,477,370 | A | 12/1995 | Little et al. |
| 5,612,647 | A | 3/1997 | Malec |
| 5,742,205 | A * | 4/1998 | Cowen et al. .............. 330/276 |
| 5,793,253 | A | 8/1998 | Kumar et al. |
| 5,920,240 | A | 7/1999 | Alexanian et al. |
| 5,939,766 | A | 8/1999 | Stolmeijer et al. |
| 5,973,557 | A | 10/1999 | Miyaji et al. |
| 6,011,438 | A | 1/2000 | Kakuta et al. |
| 6,057,571 | A | 5/2000 | Miller et al. |
| 6,107,885 | A * | 8/2000 | Miguelez et al. ........... 330/276 |
| 6,114,911 | A | 9/2000 | Iwai et al. |
| 6,121,842 | A | 9/2000 | Alderstein et al. |
| 6,351,185 | B1 | 2/2002 | Amrany et al. |
| 6,383,858 | B1 | 5/2002 | Gupta et al. |
| 6,385,033 | B1 | 5/2002 | Javanifard et al. |
| 6,417,535 | B1 | 7/2002 | Johnson et al. |
| 6,448,847 | B1 | 9/2002 | Paul et al. |

FOREIGN PATENT DOCUMENTS

| | | |
|---|---|---|
| EP | 0 379 202 A | 7/1990 |
| EP | 0 556 398 A | 8/1993 |
| FR | 1 413 073 A | 10/1965 |
| WO | WO01/56171 | 8/2001 |

OTHER PUBLICATIONS

"High Power-Added Efficiency MMIC Amplifier for 2.4 GHz Wireless Communications," Portilla et al., *IEEE Journal of Solid-State Circuits*, vol. 34, No. 1, Jan. 1999, 4 pgs.

"A 1.9-GHz, 1-W CMOS Class-E Power Amplifier for Wireless Communications," King-Chun Tsai et al., *IEEE Journal of Solid-State Circuits*, vol. 34, No. 7, pp. 962-970, Jul. 1999.

"A Monolithic Transformer Coupled 5-W Silicon Power Amplifier with 59% PAE at 0.9 GHz," Simbürger et al., *IEEE Journal of Solid-State Circuits*, vol. 34, No. 12, pp. 1881-1892, Dec. 1999.

"A Monolithic 2.5 V, 1 W Silicon Bipolar Power Amplifier with 55% PAE at 1.9 GHz," Simbürger et al., *IEEE MTT-S Digest*, pp. 853-856, 2000.

"A Common-Gate Switched, 0.9W Class-E Power Amplifier with 41% PAE in 0.25 βm CMOS," Yoo et al., Integrated Systems Laboratory (IIS), Swiss Federal Institute of Technology (ETH), Zurich, Switzerland, 2000 Symposium on VLSI Circuits Digest of Technical Papers, pp. 56 and 57, 2000.

"Monolithic Transformers for Silicon RF IC Design," John R. Long, *IEEE Journal of Solid-State Circuits*, vol. 35, No. 9, pp. 1368-1382, Sep. 2000.

"A 900-MHz Fully-Integrated SOI Power Amplifier for Single-Chip Wireless Transceiver Applications," Tan et al., *IEEE Journal of Solid-State Circuits*, vol. 35, No. 10, pp. 1481-1486, Oct. 2000.

"Design and Optimization of CMOS RF Power Amplifiers," Gupta et al., *IEEE Journal of Solid-State Circuits*, vol. 36, No. 2, pp. 166-175, Feb. 2001.

"A 2.4-GHz, 2.2-W, 2-V Fully Integrated CMOS Circular-Geometry Active-Transformer Power Amplifier," Submitted to CICC—IEEE Custom Integrated Circuits Conference, San Diego, May 6-9, 2001, Aoki et al., Department of Electrical Engineering, California Institute of Technology, Pasadena, Ca 91125, 5 pgs., May 2001.

"7-MHz, 1.1-kW Demonstration of the New $E/F_{2,odd}$ Switching Amplifier Class," Kee et al., Department of Electrical Engineering, California Institute of Technology, Pasadena, CA 91125, 4 pgs., 2001.

Search Report for PCT/US01/31813 dated Jun. 17, 2003 in PCT filing from parent U.S. Appl. No. 09/974,578, 9 pgs.

"Solid State Power Amplifier Using Impedance-Transforming Branch-Line Couplers for L-Band Satellite Systems," Robertson et al., Proceedings of the 23$^{rd}$ European Microwave Conference, Madrid, Sep.6-9, 1993, Proceedings of the European Microwave Conference, Turnbridge Wells, Reed Exhibition Company, GB, Sep. 6, 1993, pp. 448-450.

Search Report for PCT/US03/07157 dated Mar. 29, 2004, 4 pgs.

"Distributed Active Transformer-A New Power-Combination and Impedance-Transformation Technique," Aoki et al., *IEEE Transactions on Microwave Theory and Techniques*, vol. 50, No. 1, pp. 316-3331, Jan. 2002.

\* cited by examiner

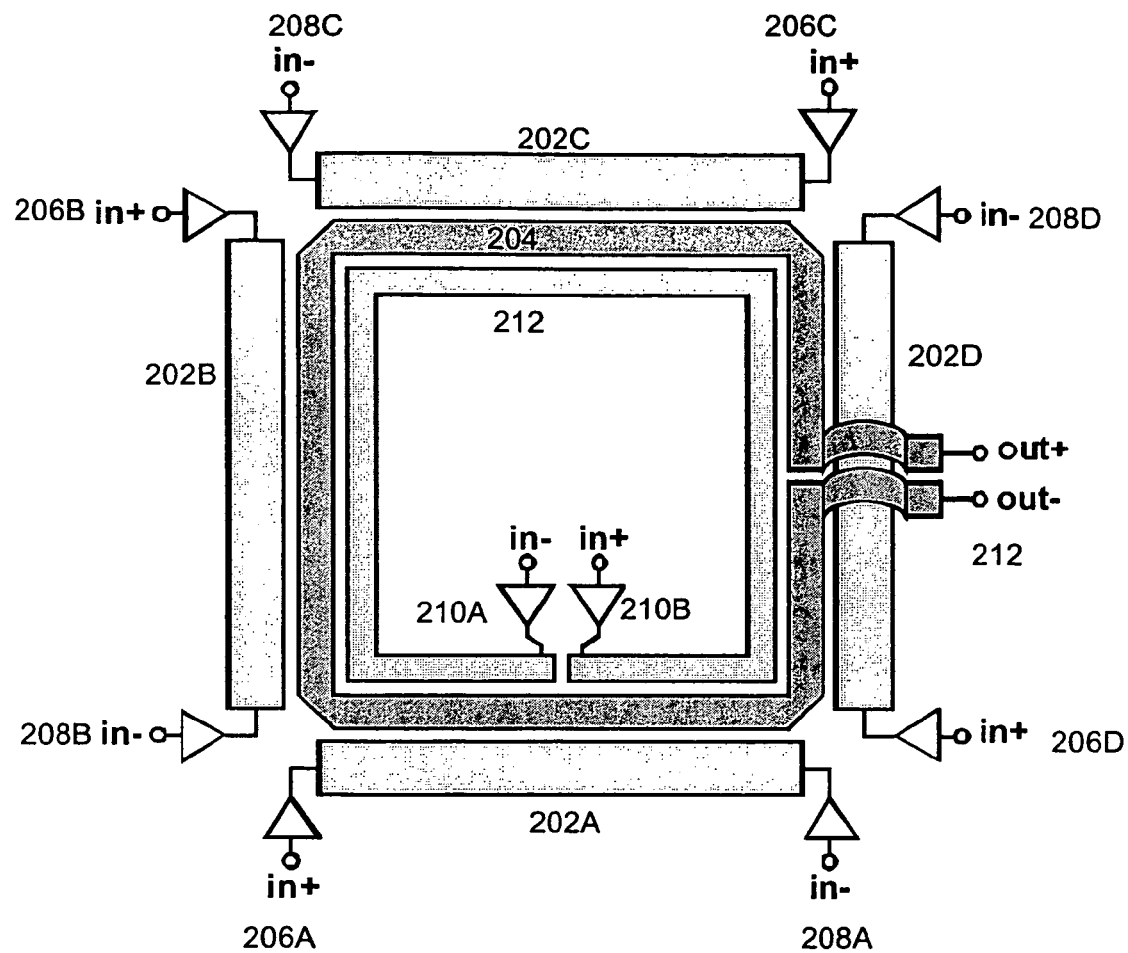
FIGURE 2    200

RECONFIGURABLE DISTRIBUTED ACTIVE TRANSFORMERS

CROSS-REFERENCE TO RELATED APPLICATIONS

This application is a continuation of U.S. patent application Ser. No. 11/037,527 filed Jan. 18, 2005, now U.S. Pat. No. 7,119,619 which is a continuation of U.S. patent application Ser. No. 10/386,001 filed Mar. 11, 2003, now U.S. Pat. No. 6,856,199 which claims priority from U.S. Provisional Patent Application No. 60/363,424, filed Mar. 11, 2002, and is a continuation-in-part of U.S. patent application Ser. No. 09/974,578, filed Oct. 9, 2001, now U.S. Pat. No. 6,816,012 which claims priority to U.S. Provisional Patent Application No. 60/239,470 filed Oct. 10, 2000; U.S. Provisional Patent Application No. 60/239,474 filed Oct. 10, 2000; and U.S. Provisional Patent Application No. 60/288,601 filed May 4, 2001.

The U.S. Government has a paid-up license in this invention and the right in limited circumstances to require the patent owner to license others on reasonable terms as provided for by the terms of ECS-0083220 awarded by NSF.

FIELD OF THE INVENTION

The present invention pertains to the field of distributed active transformers. More specifically, the invention relates to distributed active transformers that include features that provide additional control over operational parameters.

BACKGROUND OF THE INVENTION

A distributed active transformer includes a primary winding that uses active devices to control the current direction and magnitude on the winding. For example, U.S. patent application Ser. No. 09/974,578, filed Oct. 9, 2001, describes distributed active transformers that can comprise at least two push/pull amplifiers designed to amplify an RF input signal. The distributed active transformer can be operated where a first amplifier causes current to flow on the primary winding in a first direction, and where a second amplifier causes current to flow on the primary in a second direction. In this manner, an alternating current is induced on the secondary winding.

SUMMARY OF THE INVENTION

In accordance with the present invention, a distributed active transformer is provided that overcomes known problems with existing transformers.

In particular, a distributed active transformer is provided that allows sections of the distributed active transformer to be independently controlled.

In accordance with an exemplary embodiment of the present invention, a distributed active transformer is provided. The distributed active transformer includes a primary winding having two or more sets of push/pull amplifiers, where each set of push/pull amplifiers is used to create an alternating current on a section of the primary winding. A secondary winding is disposed adjacent to the primary winding, such that the alternating current on the primary induces alternating current on the secondary. The primary winding and the secondary winding can be disposed on a semiconductor substrate.

The present invention provides many important technical advantages. One important technical advantage of the present invention is a distributed active transformer that allows sections of the distributed active transformer to be independently controlled, so as to adjust the operating parameters of the distributed active transformer.

Those skilled in the art will appreciate the advantages and superior features of the invention together with other important aspects thereof on reading the detailed description that follows in conjunction with the drawings.

BRIEF DESCRIPTION OF THE SEVERAL VIEWS OF THE DRAWINGS

FIG. 2 is a diagram of a distributed active transformer with two primary windings in accordance with an exemplary embodiment of the present invention;

DETAILED DESCRIPTION OF THE INVENTION

Figure 1:
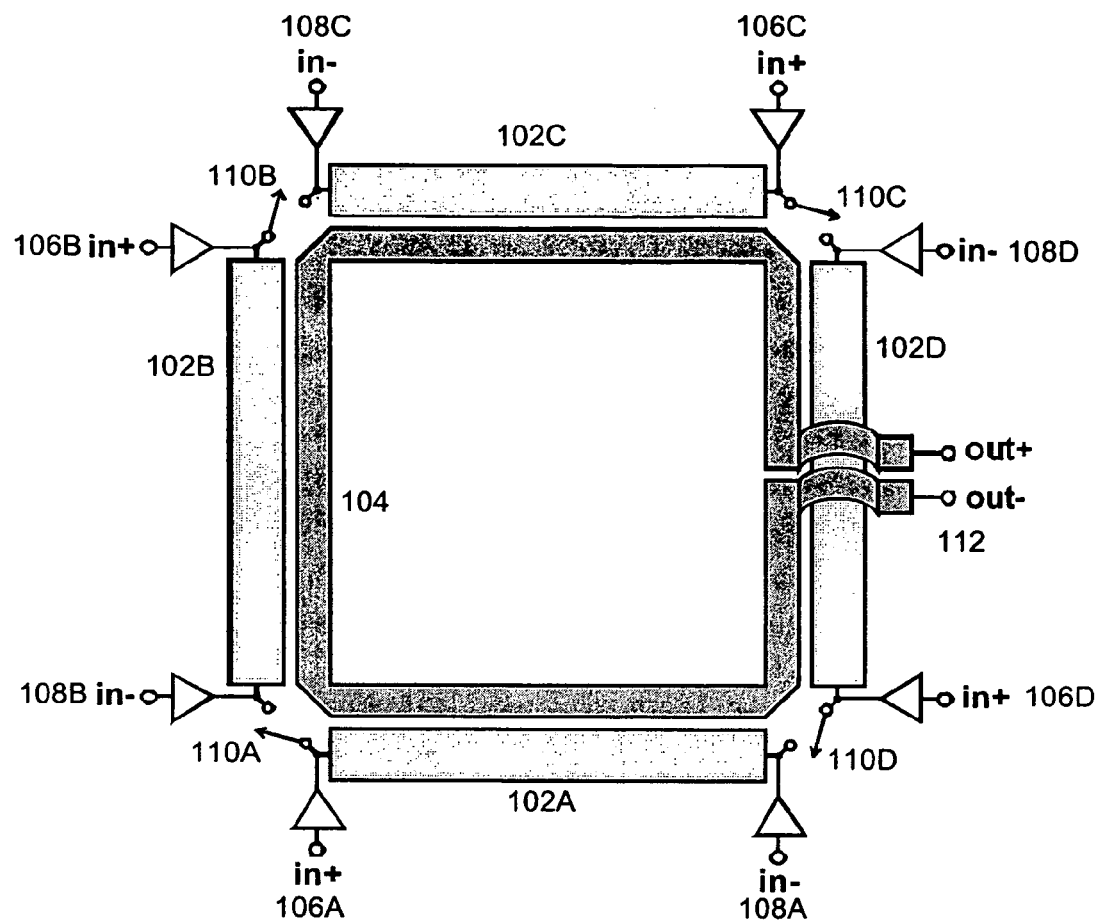
FIG. 1 is a diagram of a distributed active transformer in accordance with an exemplary embodiment of the present invention.

In the description that follows like parts are marked throughout the specification and drawings with the same reference numerals, respectively. The drawing figures are not necessarily to scale and certain features may be shown in somewhat generalized or schematic form in the interest of clarity and conciseness.

Figure 1A:
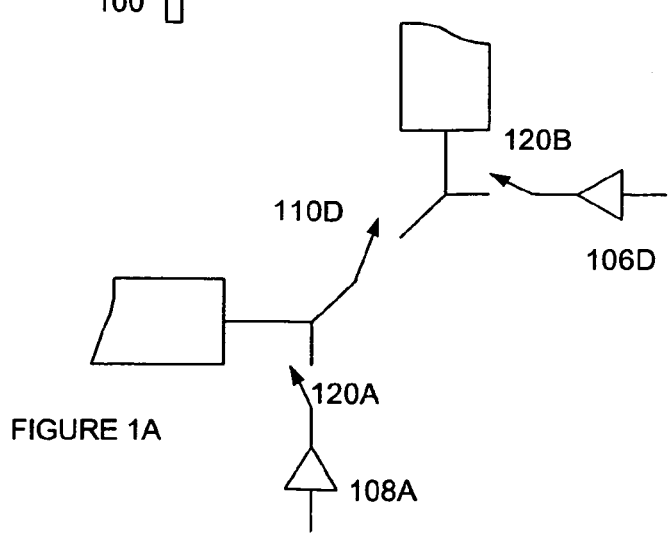

FIGS. 1 AND 1A are diagrams of distributed active transformer 100 in accordance with an exemplary embodiment of the present invention. Distributed active transformer 100 allows the number of primary sections in the primary winding of a distributed active transformer to be reconfigured.

Distributed active transformer 100 includes primary winding sections 102A, 102B, 102C, and 102D, and secondary winding 104. Each primary winding section has an associated push/pull amplifier pair that includes amplifiers 106A and 108A for primary winding section 102A, amplifiers 106B and 108B for primary winding section 102B, amplifiers 106C and 108C for primary winding section 102C, and amplifiers 106D and 108D for primary winding section 102D. The amplifiers can be implemented using bipolar junction transistors (BJTs), metal oxide semiconductor field-effect transistors (MOSFETs), hetero-junction bipolar transistors (HBTs), metal-semiconductor field effect transistors (MESFETs), lateral double-diffused metal oxide semiconductor transistors (LDMOSs), complementary MOS transistors (CMOS), or other suitable devices. Amplifier 106A drives current to the positive terminal of primary winding section 102A, whereas amplifier 108A drives current from the negative terminal of primary winding section 102A. The polarities of the amplifiers can be alternated to reverse the direction of current flow. A drain voltage $V_{dd}$ (not explicitly shown) may alternatively be provided at a midway point, corner, or at other suitable locations on each primary winding section to provide the current source or other suitable configurations can be used to create time-varying current on the primary winding sections using the push/pull amplifier pairs. A similar configuration is used for primary winding sections 102B, 102C, and 102D.

Each push/pull amplifier pair of each primary winding section can be controlled so that the current flowing on the primary winding section alternates in direction and magnitude in a manner that creates a magnetic field that induces an electromotive force (EMF) on secondary winding 104. The EMF causes current to flow in secondary winding 104, based on the impedance of that winding and any associated circuit. The current through the push/pull amplifier pairs can be controlled so as to adjust both the current and the voltage induced in this manner on secondary winding 104.

Switches 110A, 110B, 110C, and 110D can be implemented as transistors, micro-electromechanical devices (MEMS), or other suitable devices, and are connected to a one amplifier out of each set of two adjacent push/pull amplifier pairs, such that the two adjacent push/pull amplifiers can be bypassed and a new push/pull amplifier pair can be created. As used herein, "connect" and its cognate terms such as "connects" or "connected" can refer to a connection through a conductor, a semiconducting material, or other suitable connections. In one exemplary embodiment, amplifiers 106A and 108B are connected to switch 110A, such that the amplifiers can be bypassed by closing switch 110A. In this embodiment, amplifiers 106B and 108A would then form the push/pull amplifier pair for primary winding sections 102A and 102B. Likewise, a similar configuration can be provided for switches 110B, 110C and 110D. In this regard, it should be noted that the set of push/pull amplifiers that the switches are connected to is different from the set of push/pull amplifiers that service each primary winding section. Nevertheless, each switch can operate to bypass one amplifier from a first push/pull amplifier pair and a second amplifier from a second push/pull amplifier pair so as to result in the remaining amplifiers from those two push/pull amplifier pairs operating as a push/pull amplifier pair on a combined primary winding section.

For example, if switch 110A is closed, the power level generated by distributed active transformer 100 is less than the power level that is generated for distributed active transformer 100 with all switches open. The current magnitude through secondary winding 104 will be determined by the sum of the electromotive forces induced on the secondary by each primary winding section, which equals the change in flux linkages over time (dΦ/dt) which is determined by the mutual inductance of the primary and the secondary and the change in the current of the secondary (M*dI/dt.)

When a push-pull configuration is used with no $V_{dd}$ points, closing a single switch 110 results in an increased impedance for each remaining push/pull amplifier pair that drives current through the two connected primary winding sections. This configuration decreases the output power by increasing the impedance seen by the remaining amplifiers. Alternately, the winding sections can be capacitively coupled, such that the impedance seen by each amplifier remains the same, but where power is controlled by turning off or switching out amplifier sections. In either configuration, turning off amplifiers results in a decrease in output power and can be used to lower the overall power dissipation of the amplifier.

When a push-pull configuration is used that includes $V_{dd}$ points, with a single switch 110 closed, one quarter of the primary winding section will not be carrying any current, as no current will flow between the $V_{dd}$ points of the two connected primary winding sections.

In the described configurations, closing one switch can decrease the flux linkages between the primary and secondary windings, such that the open loop voltage on the secondary will be decreased to fraction of the maximum open loop voltage that could be realized with all switches 110A through 110D open. Likewise, with two and three switches 110 closed, the open loop voltage will drop more. Thus, distributed active transformer 100 can operate in four different modes of operation—a maximum power mode with all switches 110A through 110D open, a medium-high power mode, with any one of switches 110A through 110D closed, a medium-low power mode with any two of switches 110A through 110D closed, and a low power mode with any three of switches 110A through 110D closed. The power levels will be a function of whether the impedance seen by each amplifier is constant or varies as a function of the switches that are closed, as well as other factors.

In addition to providing different power modes of operation with switches 110A through 110D, the biasing current required for each of the bypassed amplifiers can also be decreased, such that the bias current requirements for distributed active transformer 100 can also be controlled. For example, with all switches 110A through 110D open, the bias current required for each of amplifiers 106A and 108A through 106D and 108D can be at a maximum. If switch 110A is closed, then the bias current required for amplifiers 106A and 108B can decrease. In this manner, bias current requirements for distributed active transformer 100 can be controlled through the use of switches 110A through 110D, where suitable. Likewise, the bias current for a given power level can be optimized by determining the power level range for a given switch setting, and using the range that provides the lowest bias current for the expected range of operation. For example, if the expected power levels for the operating range of an application would fall within either the power level range for operation of distributed active transformer 100 with either two of switches 110 closed or three of switches 110 closed, then operation of distributed active transformer 100 with three of switches 110 closed would satisfy the power requirements for the operating range while minimizing the bias current required to support operation.

FIG. 1A shows an exemplary configuration of switches 120A and 120B, which can be used to connect or disconnect amplifiers 108A and 106D, respectively, from distributed active transformer 100 while allowing 102A and 102D to be independently coupled or decoupled. The exemplary configuration of switches 120A and 120B can be implemented at each connection between each primary winding section, secondary winding sections (if such sections are used), or in other suitable locations. Switches 120A and 120B thus provide additional flexibility for the configuration of distributed active transformer 100.

In operation, distributed active transformer 100 allows the power capability and biasing current requirements to be controlled through the operation of switches 110A through 110D. In this manner, additional control of the power output and power consumption of a distributed active transformer is provided.

FIG. 2 is a diagram of distributed active transformer 200 with two primary windings in accordance with an exemplary embodiment of the present invention. Additional primary and secondary windings can likewise be provided for additional power conversion control, either internal or external to the secondary winding.

Distributed active transformer 200 includes first primary winding sections 202A, 202B, 202C, and 202D, and second primary winding 212. Secondary winding 204 is disposed between the first primary winding sections 202A through 202D and second primary winding 212. For the first primary winding sections, push/pull amplifiers 206A and 208A are associated with primary winding section 202A, push/pull amplifiers 206B and 208B are associated with primary winding section 202B, push/pull amplifiers 206C and 208C are associated with primary winding section 202C, and push/pull amplifiers 206D and 208D are associated with primary winding section 202D. Likewise, push/pull amplifiers 210A and 210B are associated with second primary winding 212, although a single driver amplifier can alternatively be used where suitable. The secondary winding has an output 214.

Distributed active transformer 200 can operate with primary winding sections 102A through 102D active and second primary winding 212 inactive. In this mode, distributed active transformer 200 can provide higher power but with increased bias current requirements. Likewise, distributed active transformer 200 can operate with primary winding sections 102A through 102D inactive and with second primary winding 212 active. In this exemplary embodiment, the power delivered to output 214 can be lower than the power delivered to output 214 when first primary winding sections 202A through 202D are activated, but the bias current required can be lower than the bias required with primary winding sections 202A through 202D active.

In another exemplary embodiment, the spacing between second primary winding 212 and secondary winding 204 can be increased, so as to decrease the magnetic coupling between the primary and secondary windings. The power loss in second primary winding 212 when it is not being used can thus be decreased, as well as the voltage breakdown requirements of push/pull amplifiers 210A and 210B. Additional primary windings can likewise be provided, depending on the power levels required and the available space.

In operation, distributed active transformer 200 can be operated in a first mode for high power with high bias current requirements by activation of primary winding sections 202A through 202D, and in a second mode with lower power and bias current requirements by activation of second primary winding 212. Use of a first primary winding and a second primary winding allows the power output and bias current requirements for a distributed active transformer to be adjusted as needed by switching between primaries.

Figure 3:
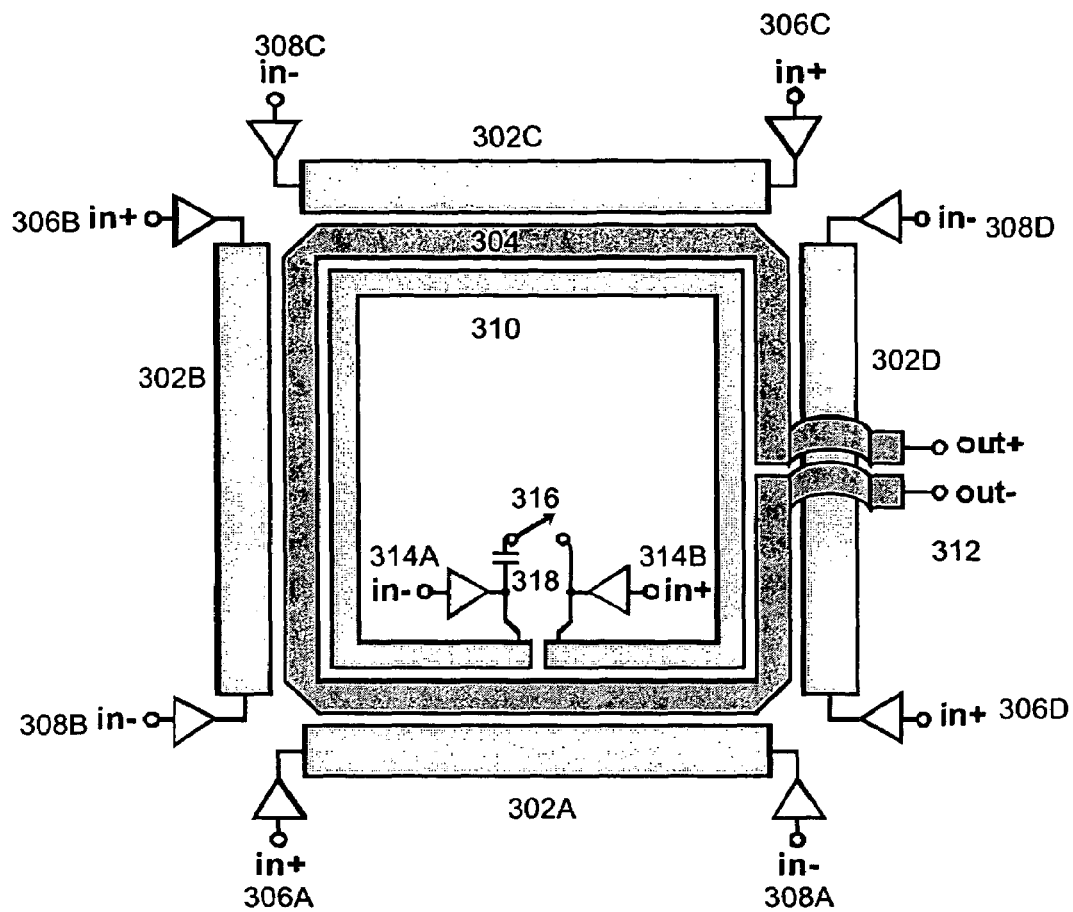
FIGS. 3 and 3A are diagrams of a distributed active transformer with first and second primary windings and compensating capacitors in accordance with an exemplary embodiment of the present invention.
Figure 3A:
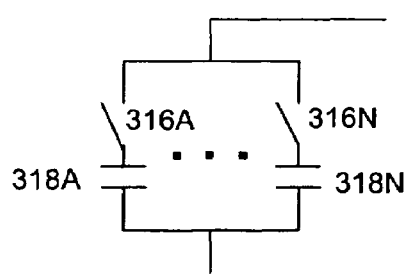

FIGS. 3 AND 3A are diagrams of distributed active transformer 300A with first and second primary windings and compensating capacitors in accordance with an exemplary embodiment of the present invention. Distributed active transformer 300A allows the power loss caused by circulating currents in an unused primary winding to be mitigated through the use of a switched series capacitance, as well as decreasing the breakdown voltage imposed on the associated primary winding amplifiers.

Distributed active transformer 300A includes primary winding sections 302A through 302D with associated push/pull amplifier pairs 306A and 308A through 306D and 308D, respectively, and secondary winding 304 with output 312. Likewise, second primary winding 310 includes push/pull amplifiers 314A and 314B, which can be connected using switch 316 through capacitor 318. When capacitor 318 is connected in parallel with second primary winding 310 through switch 316, an LC resonant circuit can be formed with secondary winding 304. When second primary winding 310 is not in use, switch 316 can be opened to take second primary winding 310 out of resonance with secondary winding 304 and decrease losses due to circulating currents, as well as to decrease the peak voltage imposed on push/pull amplifiers 314A and 314B when they are inactive. In general, capacitors can be switched into and out of windings in other suitable configurations, to take the windings in and out of resonance with other windings.

As shown in FIG. 3A, a suitable configuration of switches and capacitors can be used in lieu of a single switch 316 and capacitor 318, where each switch-capacitor pair can be controlled separately, thus allowing the resonance frequency of the secondary loop to be adjusted. In one exemplary embodiment, this combination can be used to adjust the center frequency of a power amplifier so as to achieve a flat gain and efficiency response across multiple frequency bands or channels, to account for manufacturing process variations, to account for temperature variations, or for other suitable purposes.

Figure 4:
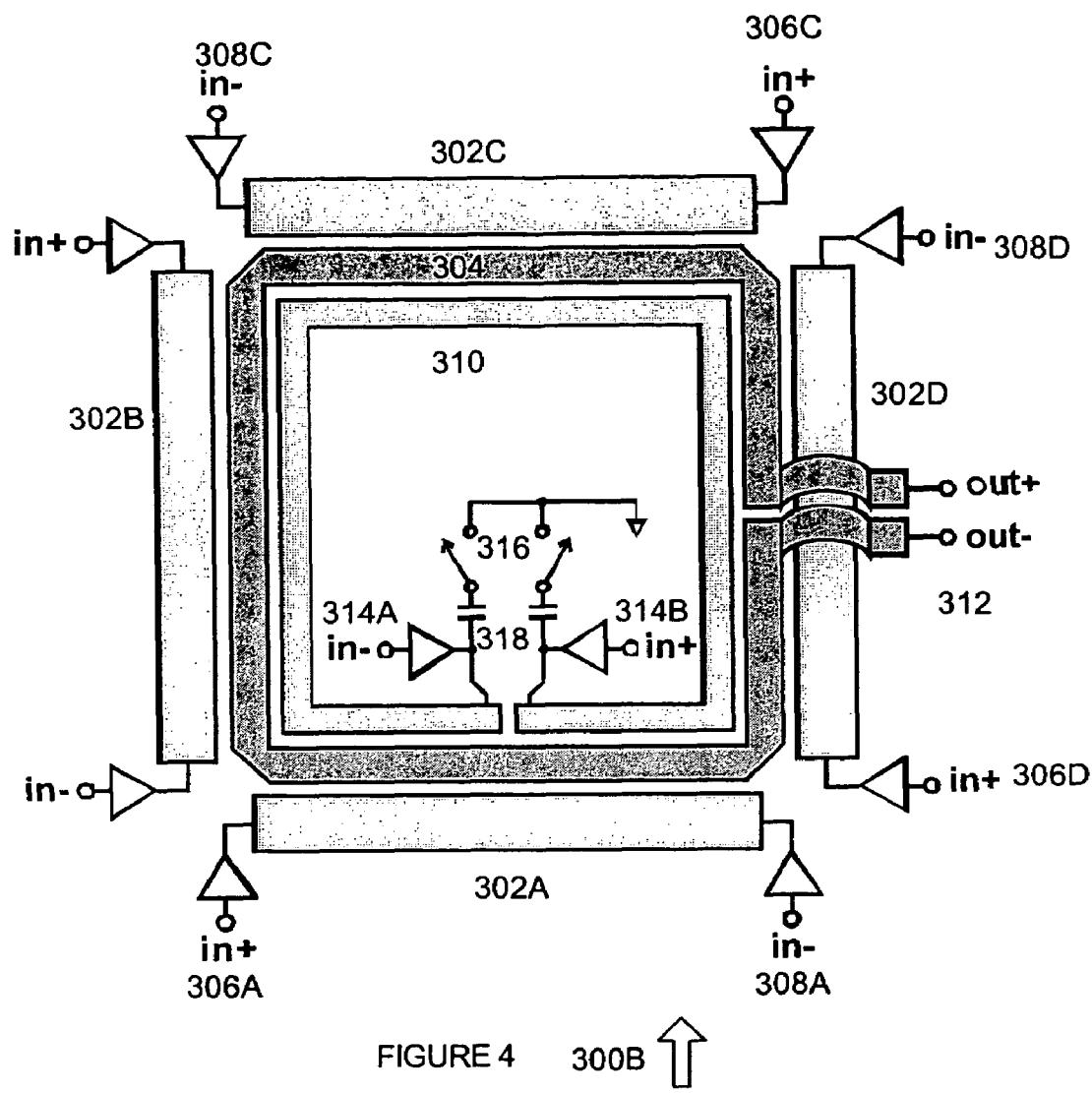
FIG. 4 is a diagram of a distributed active transformer with first and second primary windings and compensating capacitors in accordance with another exemplary embodiment of the present invention.

FIG. 4 is a diagram of distributed active transformer 300B with first and second primary windings and compensating capacitors in accordance with an exemplary embodiment of the present invention. Distributed active transformer 300B allows the power loss caused by circulating currents in an unused primary winding to be mitigated through the use of switched capacitors, as well as decreasing the breakdown voltage imposed on the associated primary winding amplifiers.

Distributed active transformer 300B includes primary winding sections 302A through 302D with associated push/pull amplifier pairs 306A and 308A through 306D and 308D, respectively, with secondary winding 304 and output 312. Likewise, second primary winding 310 includes push/pull amplifiers 314A and 314B, which can be connected using switches 316 through capacitors 318. When capacitors 318 are connected to second primary winding 310 through switches 316, an LC resonant circuit is created with secondary winding 304. When second primary winding 310 is not in use, switches 316 can be opened to take second primary winding 310 out of resonance with secondary winding 304 and decrease losses due to circulating currents, as well as to decrease the peak voltage imposed on push/pull amplifiers 314A and 314B when they are inactive.

Figure 5:
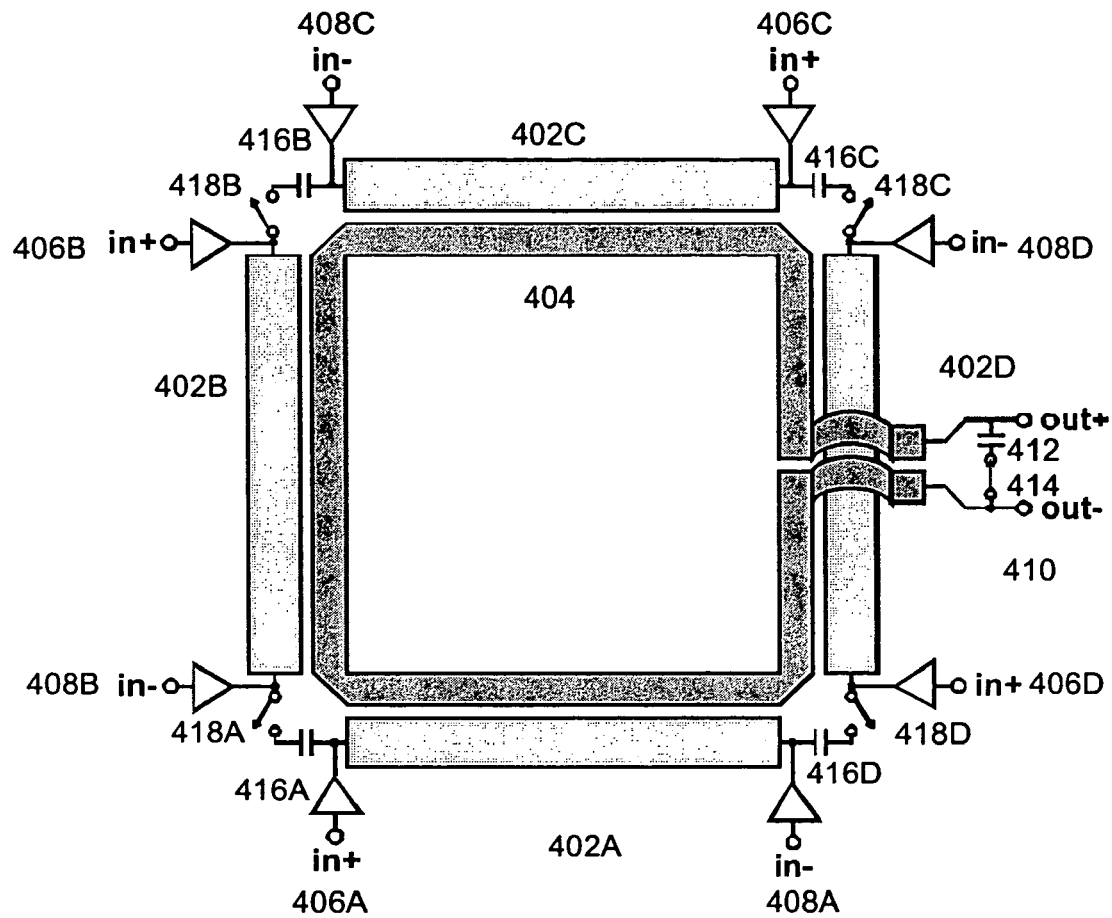
FIG. 5 is a diagram of a distributed active transformer with impedance transformation ratio correction and resonance frequency selection in accordance with an exemplary embodiment of the present invention.

FIG. 5 is a diagram of distributed active transformer 400 with impedance transformation ratio correction and resonance frequency selection in accordance with an exemplary embodiment of the present invention. Distributed active transformer 400 includes primary winding sections 402A through 402D with associated push/pull amplifiers 406A and 408A through 406D and 408D, respectively. Switches 418A through 418D are connected in series with capacitors 416A through 416D, respectively. Output 410 of secondary winding 404 includes switch 414 and capacitor 412 for impedance transformation ratio control. Alternatively, switch 414 and capacitor 412 can be omitted, such as where it is desirable only to allow the resonance frequency of distributed active transformer 400 to be controlled. Likewise, a suitable configuration of switches and capacitors can be used in lieu of a single switch 414 and capacitor 412, where each switch-capacitor pair can be controlled separately, thus allowing the resonance frequency of the secondary loop to be adjusted.

In this exemplary embodiment, the power operation mode of distributed active transformer 400 can be controlled, such as by closing one or more of switches 418A through 418D, so as to insert capacitors 416A through 416D in series with primary winding sections 402A through 402D. In this manner, a series LC circuit is created to compensate for leakage inductance between the primary winding sections 402A through 402D and secondary winding 404. Thus, by placing one or more of capacitors 416A through 416D in series with primary winding sections 402A though 402D, the maximum output power is decreased, but the bias current required to achieve a gain level is also decreased. Alternatively, if capacitor 412 is placed in parallel across the load by closing switch 414 to compensate for this leakage inductance, then the impedance transformation ratio is increased, which increases the maximum output power but which also increases the bias current requirements.

In addition, the resonant frequency of distributed active transformer 400 can be adjusted for a particular frequency of operation by switching in capacitors 416A through 416D. In this manner, the efficiency and power output by distributed active transformer 400 can be optimized for a desired frequency of operation by configuring it for resonance at that frequency. Thus, depending on the sizes of the capacitors, distributed active transformer 400 can be operated in a first mode either with or without switch 414 and capacitor 412 to change the impedance transformation ratio by compensating for winding leakage inductance, in a second mode without switch 414 and capacitor 412 to change the resonant frequency of distributed active transformer 400, or in both modes simultaneously. Likewise, a suitable configuration of switches and capacitors can be used in lieu of switches 418 and capacitors 416, where each switch-capacitor pair can be controlled separately, thus allowing the resonance frequency of the primary loop to be adjusted.

Figure 6:
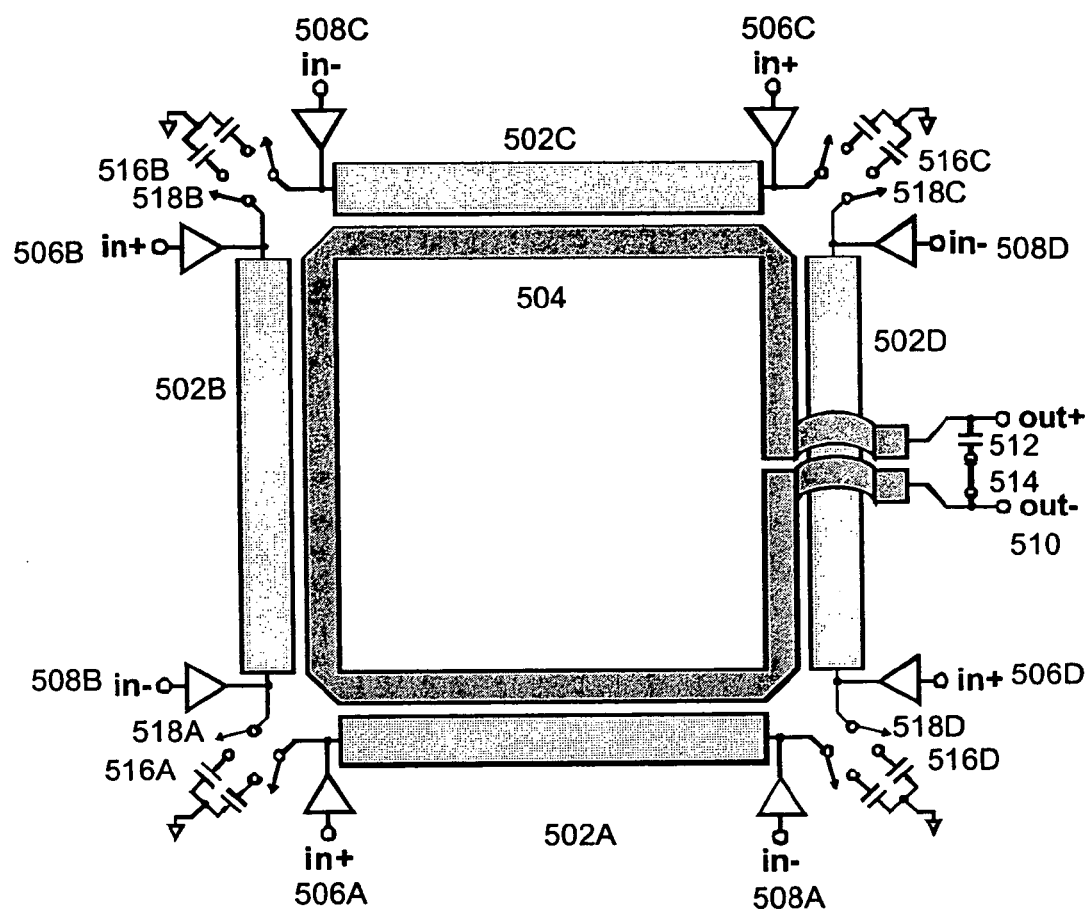
FIG. 6 is a diagram of a distributed active transformer with switched-in capacitors that are in parallel with amplifiers in accordance with an exemplary embodiment of the present invention.

FIG. 6 is a diagram of distributed active transformer 500 with switched-in capacitors that are in parallel with amplifiers 506A and 508A through 506D and 508D, in accordance with an exemplary embodiment of the present invention. Distributed active transformer 500 includes primary windings sections 502A through 502D with associated push/pull amplifiers 506A and 508A through 506D and 508D, respectively. Switch pairs 518A through 518D are connected in series with capacitor pairs 516A through 516D, respectively. Output 510 of secondary winding 504 includes switch 514 and capacitor 512 for impedance transformation ratio control. Alternatively, switch 514 and capacitor 512 can be omitted, such as where it is desirable to allow the resonance frequency of distributed active transformer 500 to be controlled.

In this exemplary embodiment, the power operation mode of distributed active transformer 500 can be controlled, such as by closing one or more of switch pairs 518A through 518D, so as to insert capacitor pairs 516A through 516D in series with primary winding sections 502A through 502D. In this manner, a series LC circuit is provided to compensate for leakage inductance between the primary winding sections 502A through 502D and secondary winding 504. Thus, by placing one or more of capacitor pairs 516A through 516D in series with primary winding sections 502A though 502D, the maximum output power is decreased, but the bias current required to achieve a gain level is also reduced. Alternatively, if capacitor 512 is placed in parallel across the load by closing switch 514 to compensate for this leakage inductance, then the impedance transformation ratio is increased, which increases the maximum output power but which also increases the bias current requirements.

In addition, the resonant frequency of distributed active transformer 500 can be adjusted for a particular frequency of operation by switching in capacitor pairs 516A through 516D. In this manner, the efficiency and power output of distributed active transformer 500 can be optimized for a desired frequency of operation by placing it in resonance for that frequency. Thus, depending on the sizes of the capacitors, distributed active transformer 500 can be operated in a first mode either with or without switch 514 and capacitor 512 to change the impedance transformation ratio by compensating for winding leakage inductance, in a second mode without switch 514 and capacitor 512 to change the resonant frequency of distributed active transformer 500, or in both modes simultaneously.

Figure 7:
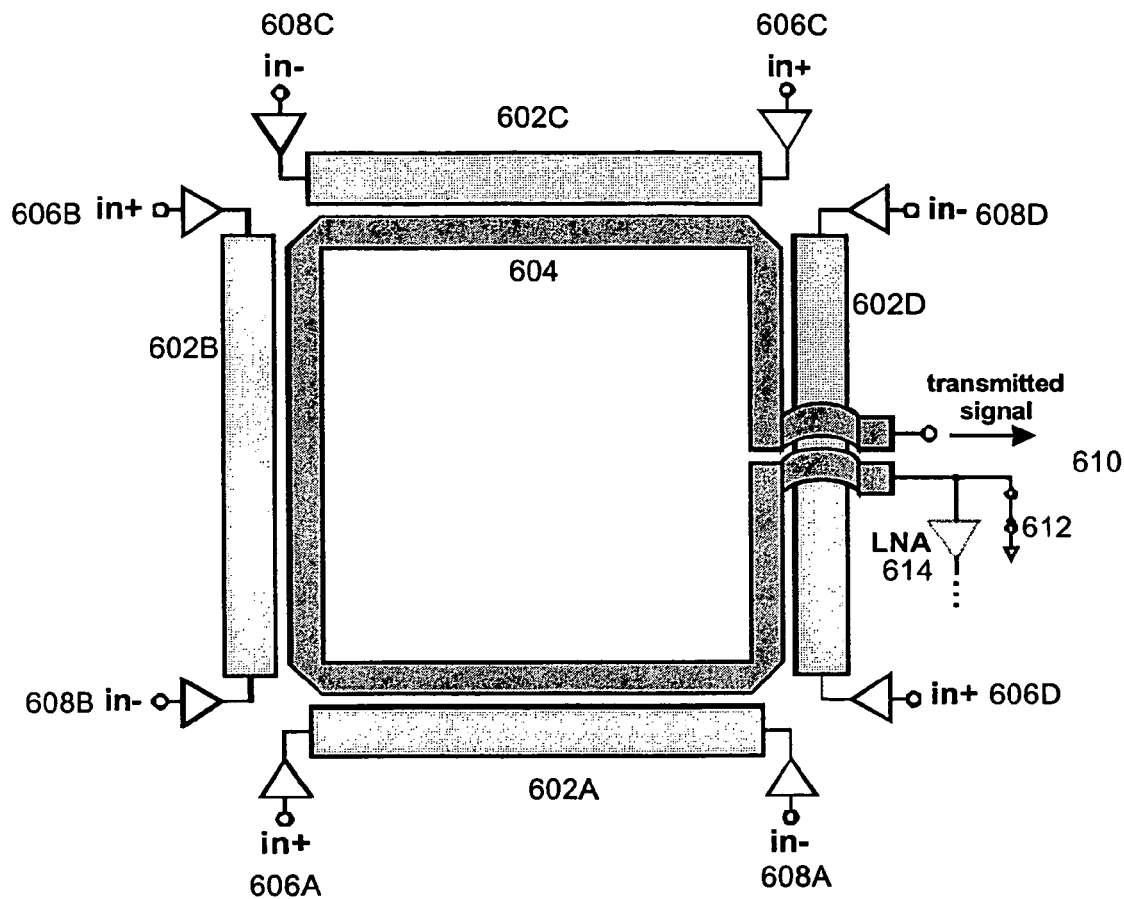
FIG. 7 is a diagram of a distributed active transformer with a low noise amplifier in accordance with an exemplary embodiment of the present invention.

FIG. 7 is a diagram of distributed active transformer 600 integrated with a low noise amplifier in accordance with an exemplary embodiment of the present invention.

In addition to the primary and secondary windings and associated push/pull amplifiers previously described, distributed active transformer 600 includes a low noise amplifier 614 and associated switch 612. When switch 612 is closed, as shown, a transmitted signal can be provided by modulating the input through push/pull amplifiers 606A and 608A through 606D and 608D. When switch 612 is opened and push/pull amplifier pairs 606A and 608A through 606D and 608D are not operated, a received signal can be fed through an inductor coil formed by the secondary winding of distributed active transformer 600, and low noise amplifier 614 can be used to process the signal. In this manner, integration of low noise amplifier 614 with switch 612 through a single-ended output of distributed active transformer 600 allows a receiver/transmitter architecture to be implemented. In one exemplary embodiment, distributed active transformer 600 can be used in place of a transmit switch in a transceiver, or for other suitable applications.

Figure 8:
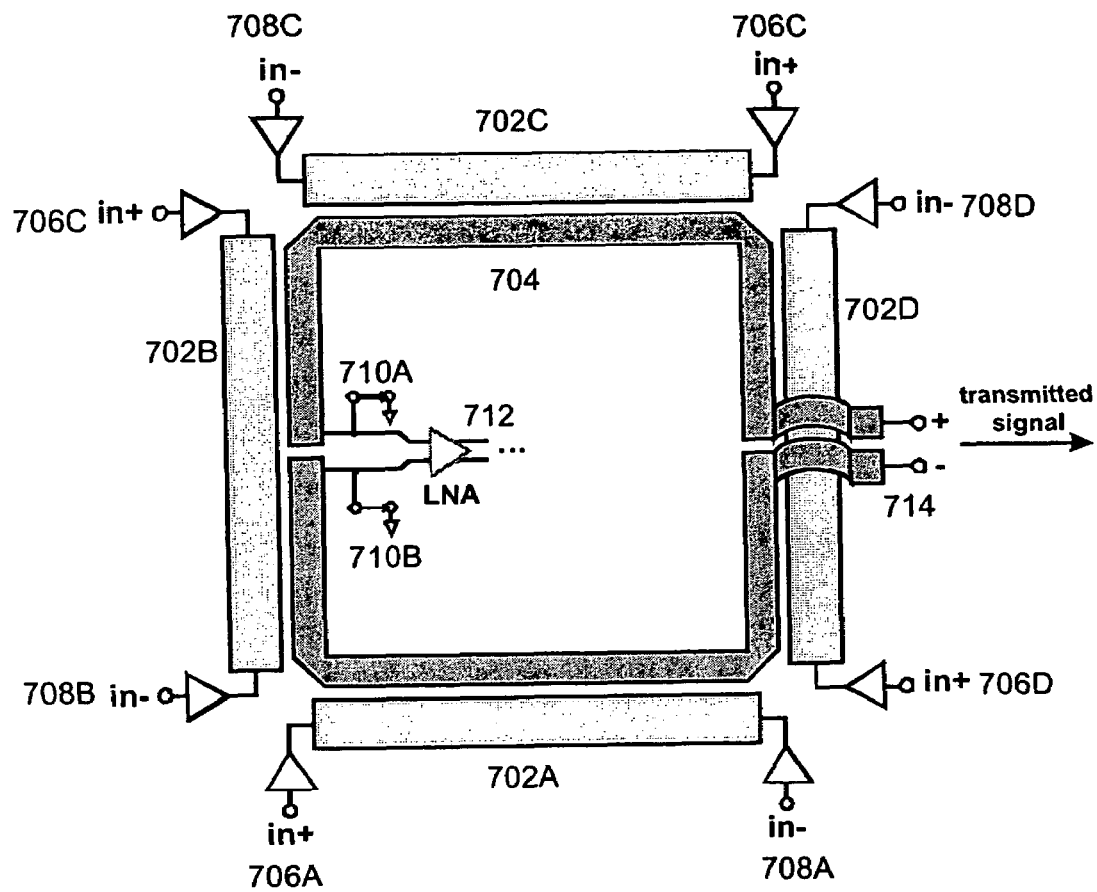
FIG. 8 is a diagram of a distributed active transformer with a low noise amplifier in accordance with another exemplary embodiment of the present invention.

FIG. 8 is a diagram of distributed active transformer 700 with a low noise amplifier in accordance with another exemplary embodiment of the present invention. Although a low noise amplifier is shown, any suitable device can be used, including but not limited to a mixer, a transceiver, a filter, and a digital to analog converter.

In addition to the primary and secondary winding structures and associated push/pull amplifiers previously described, distributed active transformer 700 includes a split secondary winding 704 with switches 710A and 710B connected to low noise amplifier 712. Distributed active transformer 700 can be operated in a first transmit mode with switches 710A and 710B closed, as shown, and in a second receive mode with switches 710A and 710B open. When switches 710A and 710B are open, low noise amplifier 712 can be used to amplify a signal received at input 714. When switches 710A and 710B are closed, primary winding sections 702A through 702D of distributed active transformer 700 can be driven by push/pull amplifiers 706A and 708A through 706D and 708D, respectively, so that an input signal can be amplified and provided for transmission at input 714.

Although exemplary embodiments of the system and method of the present invention has been described in detail herein, those skilled in the art will also recognize that various substitutions and modifications can be made to the systems and methods without departing from the scope and spirit of the appended claims.

What is claimed is:

1. A transceiver having a distributed active transformer comprising:
   a primary winding having one or more pairs of amplifiers at different points;
   a secondary winding disposed adjacent to the primary winding; and
   wherein the amplifiers are independently controlled and switched into and out of the primary winding.

2. The distributed active transformer of claim 1 wherein the primary winding further comprises two or more sections, wherein each section terminates in one of the pairs of amplifiers.

3. The distributed active transformer of claim 1 further comprising one or more additional primary windings.

4. The transceiver of claim 1 wherein the distributed active transformer is disposed on a single chip integrated circuit package for the transceiver.

5. The transceiver of claim 1 wherein the primary winding comprises means for providing a primary winding.

6. The transceiver of claim 1 wherein the secondary winding comprises means for providing a secondary winding.

7. The distributed active transformer of claim 1 wherein the primary winding further comprises means for amplifying a signal on the primary winding.

8. The distributed active transformer of claim 1 further comprising means for providing one or more additional primary windings.

9. A single-chip transceiver including a distributed active transformer disposed on a semiconductor substrate, comprising:
   a primary winding having one or more amplifiers that are independently controlled and switched into and out of the primary winding; and
   a secondary winding disposed adjacent to the primary winding; and
   a second primary winding disposed adjacent to one of the primary winding or the secondary winding.

10. The single-chip transceiver of claim 9, wherein spacing between the second primary winding and the primary winding is increased so as to reduce power loss due to circulating currents in the second primary when the primary is driven.

11. The single-chip transceiver of claim 9 wherein spacing between the second primary winding and the primary winding is adjusted so as to reduce power loss due to circulating currents when the primary is driven.

12. The single-chip transceiver of claim 9 wherein the primary winding comprises means for amplifying a signal.

13. The single-chip transceiver of claim 9 wherein the secondary winding comprises means for providing a secondary winding.

14. The single-chip transceiver of claim 9 wherein the second primary winding comprises means for providing a second primary winding.

15. The single-chip transceiver of claim 9 further comprising means for reducing power loss due to circulating currents in the second primary when the primary is driven.

16. The transceiver of claim 1 further comprising means for adjusting a resonant frequency of the distributed active transformer.

17. The single-chip transceiver of claim 9 further comprising means for adjusting a resonant frequency of the distributed active transformer.

18. A method for providing a single-chip transceiver having a distributed active transformer comprising:
   controlling a first amplifier at a first point on a primary winding section and a second amplifier at a second point on the primary winding section so as to cause current to flow in alternating directions;
   extracting an alternating current induced in a secondary winding; and
   bypassing the second amplifier so as to cause current to flow over a portion of the first primary winding section.

19. The method of claim 18 further comprising providing a current source from a point between the first point and the second point.

20. The method of claim 18 further comprising:
   turning off the first amplifier and the second amplifier; and
   inducing an alternating current in the secondary winding using a second primary winding.

* * * * *